United States Patent
Harres et al.

(10) Patent No.: US 7,940,055 B2
(45) Date of Patent: May 10, 2011

(54) POWER LINE DIAGNOSTIC SYSTEM

(75) Inventors: Daniel Nelson Harres, Belleville, IL (US); William David Hodges, Wildwood, MO (US)

(73) Assignee: The Boeing Company, Chicago, IL (US)

( * ) Notice: Subject to any disclaimer, the term of this patent is extended or adjusted under 35 U.S.C. 154(b) by 249 days.

(21) Appl. No.: 12/392,715

(22) Filed: Feb. 25, 2009

(65) Prior Publication Data
US 2010/0215358 A1    Aug. 26, 2010

(51) Int. Cl.
*G01R 31/08* (2006.01)
(52) U.S. Cl. ........................ 324/509; 324/536
(58) Field of Classification Search ............ 324/509, 324/536
See application file for complete search history.

(56) References Cited

U.S. PATENT DOCUMENTS

| 2006/0042846 A1* | 3/2006 | Kojori et al. ............. 180/65.8 |
| 2007/0279068 A1 | 12/2007 | Harres | |

OTHER PUBLICATIONS

U.S. Appl. No. 12/349,643, filed Jan. 7, 2009, Carralero et al.
Naidu et al., "Arc Fault Detection Schemes for an Automotive 42 V Wire Harness", 2005 SAE World Congress, Detroit, Michigan, Apr. 11-14, 2005, pp. 1-11.

* cited by examiner

*Primary Examiner* — Vincent Q Nguyen
(74) *Attorney, Agent, or Firm* — Yee & Associates, P.C.; Kevin G. Fields

(57) ABSTRACT

An apparatus including a monitoring unit, a number of sensor units, a number of cables, and a number of thermoelectric generators. The number of sensor units is capable of making measurements at a number of locations on a number of power lines for a number of loads. The number of cables connects the monitoring unit to the number of sensor units. The number of thermoelectric generators is capable of generating power for at least one of the monitoring unit and the number of sensor units. The monitoring unit is capable of receiving measurements from the number of sensor units through the number of cables. The monitoring unit is capable of determining whether an arc fault has occurred from the measurements received through the number of cables.

21 Claims, 7 Drawing Sheets

POWER LINE DIAGNOSTIC SYSTEM

BACKGROUND INFORMATION

1. Field

The present disclosure relates generally to power systems and, in particular, to a method and apparatus for detecting faults in a power system. Still more particularly, the present disclosure relates to a method and apparatus for detecting arc faults in power cables in a power system.

2. Background

Power in the form of electrical energy is used to operate devices in an aircraft. For example, power is used to operate line replaceable units, air conditioners, in-flight entertainment systems, avionics, flight control computers, and other suitable devices in an aircraft.

Power for these different devices may be generated using a power supply. This power may be distributed from the power supply to one or more devices through a power line. The devices receiving power may also be referred to as loads. A power line may be two or more electrical conductors used to transmit electrical power. These conductors may be held together in a sheath and/or some other type of cover.

With these types of power systems, faults may occur with loose connections and/or reduced integrity of the power lines. These faults include hard faults. A hard fault may occur through an open and/or short condition in a power line. Diagnosing this type of fault is generally straightforward.

Intermittent faults, however, may be more difficult to identify. Intermittent faults are faults that may occur periodically and/or randomly. An intermittent fault may include an arcing fault. An arcing fault may occur when power is transferred to a load other than those that are known. For example, a parallel arcing fault may occur when an arc occurs between power lines and the associated return for the power lines. A series arcing fault may occur in which the arc occurs in series with the load. In another example, a ground arcing fault may occur when power arcs from a power line to some other conductor and/or load not part of the power system.

Currently, circuit breakers and ground fault interrupters may not trip for different types of arcs. For example, a circuit breaker does not trip for a series arc, parallel arcs, and/or ground arcs. Ground fault interrupters compare the source in return currents to insure that no leakage of current has occurred. These types of interrupters may protect against a ground arc fault but may not have any effect on a parallel arc fault or a series arc fault.

Another system may involve the use of waveform distortion techniques or direct current feedback techniques for detecting faults. These techniques may rely on an arc causing a change in voltage and/or current. These types of techniques, however, may be susceptible to false alarms. These false alarms may occur due to normal changes in the load and/or environment.

Direct current power lines may employ a direct current feedback technique to identify arcing faults. Arcing faults may be detected by performing differential measurements in the input and load currents and input and load voltages. This type of measurement system, however, may require the use of additional lines and/or cables between the power source and each load. As a result, additional costs, weight, complexity, and reduced system reliability may occur.

Other techniques may involve using sampling blocks to perform current measurements and/or voltage measurements at loads. The sampling blocks return measurements to a processor that may identify faults from the sampled currents and voltages. The information is sent back in the power cables using this type of system.

The use of sampling blocks and sending data through the power cables requires modifications and/or access to the power systems and loads to install the different components. This type of installation may be time consuming and/or expensive.

Therefore, it would be advantageous to have a method and apparatus that takes into account one or more of the issues discussed above, as well as possibly other issues.

SUMMARY

In one advantageous embodiment, an arc fault monitoring system comprises a monitoring unit associated with a power supply, a number of sensor units, a number of optical cables, and a number of thermoelectric generators. The number of sensor units is associated with a number of loads connected to the power supply by a number of power lines. The number of sensor units is capable of making measurements for the number of power lines associated with the number of loads and transmitting the measurements to the monitoring unit. The number of optical cables connects the monitoring unit to the number of sensor units. The number of optical cables is integrated with a number of sheaths covering the number of power lines. The number of thermoelectric generators is capable of generating power to operate the monitoring unit and the number of sensor units. An electric generator in the plurality of thermoelectric generators is with the monitoring unit and each of the number of sensor units. The monitoring unit is capable of controlling measurements made by the number of sensor units. The monitoring unit is capable of receiving the measurements through the number of optical cables and determining whether an arc fault has occurred from the measurements received through the number of optical cables.

In another advantageous embodiment, an apparatus comprises a monitoring unit, a number of sensor units, a number of cables, and a number of thermoelectric generators. The number of sensor units is capable of making measurements at a number of locations on a number of power lines for a number of loads. The number of cables connects the monitoring unit to the number of sensor units. The number of thermoelectric generators is capable of generating power for at least one of the monitoring unit and the number of sensor units. The monitoring unit is capable of receiving measurements from the number of sensor units through the number of cables. The monitoring unit is capable of determining whether an arc fault has occurred from the measurements received through the number of cables.

In yet another advantageous embodiment, a method is presented for monitoring a power system. Power for at least one of a monitoring unit and a number of sensor units is generated using a number of thermoelectric generators. Measurements are generated at the number of sensor units at a number of locations on a number of power lines for a number of loads in the power system. The number of thermoelectric generators is outside of the power system for the number of loads. The measurements are transmitted to the monitoring unit over a number of cables connecting the monitoring unit to the number of sensor units. A determination is made by the monitoring unit as to whether an arc fault has occurred from the measurements received from the number of sensor units through the number of cables.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives, and advantages thereof, will best be understood by reference to the following detailed description of an advantageous embodiment of the present disclosure when read in conjunction with the accompanying drawings, wherein:

DETAILED DESCRIPTION

Figure 1:
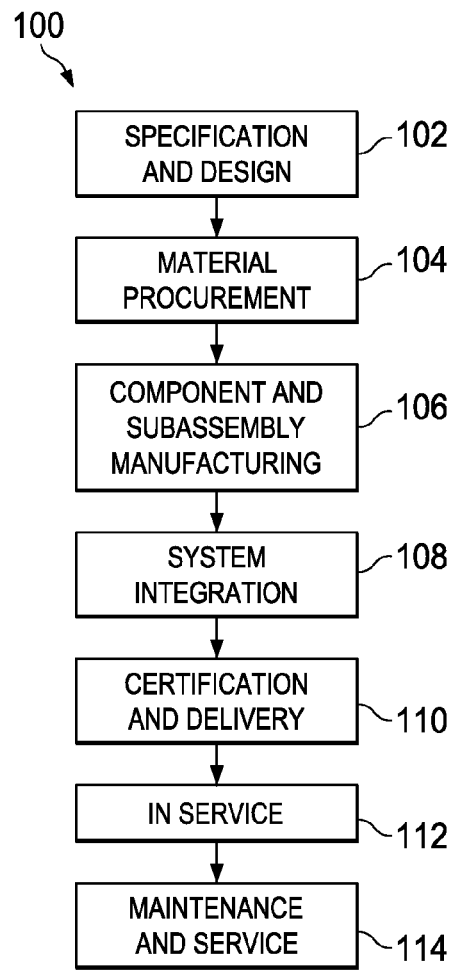
FIG. 1 is a diagram illustrating an aircraft manufacturing and service method in accordance with an advantageous embodiment.
Figure 2:
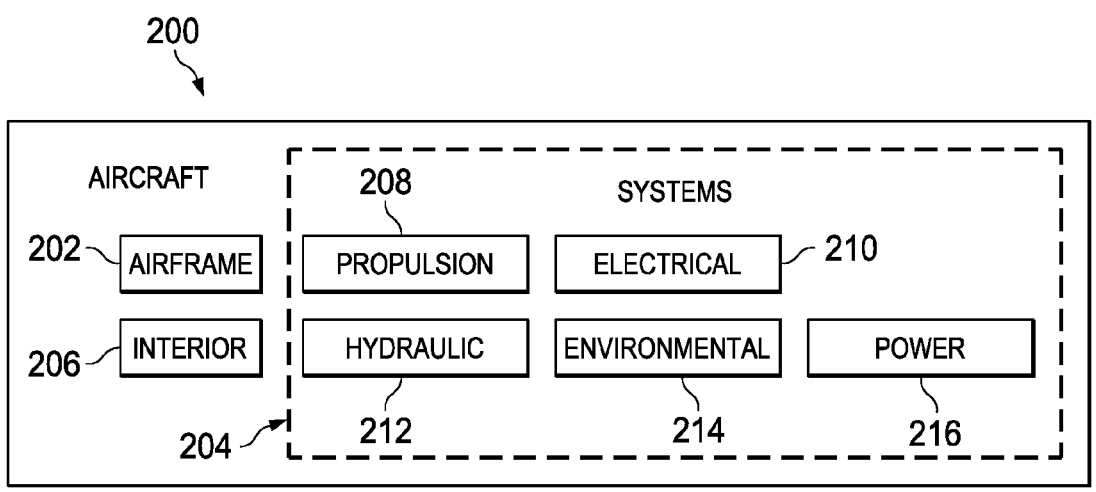
FIG. 2 is a diagram of an aircraft in which an advantageous embodiment may be implemented.

Referring more particularly to the drawings, embodiments of the disclosure may be described in the context of aircraft manufacturing and service method 100 as shown in FIG. 1 and aircraft 200 as shown in FIG. 2. Turning first to FIG. 1, a diagram illustrating an aircraft manufacturing and service method is depicted in accordance with an advantageous embodiment. During pre-production, exemplary aircraft manufacturing and service method 100 may include specification and design 102 of aircraft 200 in FIG. 2 and material procurement 104.

During production, component and subassembly manufacturing 106 and system integration 108 of aircraft 200 in FIG. 2 takes place. Thereafter, aircraft 200 in FIG. 2 may go through certification and delivery 110 in order to be placed in service 112. While in service by a customer, aircraft 200 in FIG. 2 is scheduled for routine maintenance and service 114, which may include modification, reconfiguration, refurbishment, and other maintenance or service.

Each of the processes of aircraft manufacturing and service method 100 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of venders, subcontractors, and suppliers; and an operator may be an airline, leasing company, military entity, service organization, and so on.

With reference now to FIG. 2, a diagram of an aircraft is depicted in which an advantageous embodiment may be implemented. In this example, aircraft 200 is produced by aircraft manufacturing and service method 100 in FIG. 1 and may include airframe 202 with a plurality of systems 204 and interior 206. Examples of systems 204 include one or more of propulsion system 208, electrical system 210, hydraulic system 212, environmental system 214, and power system 216. Any number of other systems may be included. Although an aerospace example is shown, different advantageous embodiments may be applied to other industries, such as the automotive industry.

Apparatus and methods embodied herein may be employed during any one or more of the stages of aircraft manufacturing and service method 100 in FIG. 1. For example, components or subassemblies produced in component and subassembly manufacturing 106 in FIG. 1 may be fabricated or manufactured in a manner similar to components or subassemblies produced while aircraft 200 is in service 112 in FIG. 1.

Also, one or more apparatus embodiments, method embodiments, or a combination thereof may be utilized during production stages, such as component and subassembly manufacturing 106 and system integration 108 in FIG. 1, for example, without limitation, by substantially expediting the assembly of or reducing the cost of aircraft 200. Similarly, one or more of apparatus embodiments, method embodiments, or a combination thereof may be utilized while aircraft 200 is in service 112 or during maintenance and service 114 in FIG. 1.

In particular, one or more of the different advantageous embodiments may be implemented in aircraft 200 during system integration 108 and/or during maintenance and service 114 to monitor power system 216. When implemented in aircraft 200, the different advantageous embodiments may be used during in service 112 to detect arc faults that may occur within power system 216 in aircraft 200 in FIG. 2.

The advantageous embodiments recognize and take into account that currently available systems for detecting faults in a power system may require additional weight, expense, and complexity to use. Further, the different advantageous embodiments take into account and also recognize that the increased complexity may reduce reliability within a power system.

The different advantageous embodiments take into account and recognize that making modifications to a power supply and/or loads may be undesirable. The different advantageous embodiments recognize and take into account that it may be undesirable to make any physical connections to an existing power system. For example, without limitation, the different advantageous embodiments recognize and take into account that it may be undesirable to power a cable monitoring system using the power supply within the power system.

Further, the different advantageous embodiments recognize and take into account that it may be undesirable to use the existing power lines in a power system to transmit data. The different advantageous embodiments recognize and take into account that transmitting information over a power line may result in noise and/or undesirable effects in the power being supplied to different loads.

Thus, the different advantageous embodiments provide an arc fault monitoring system that may be capable of monitoring power lines within a power system by reducing and/or eliminating connections to the power system. The different advantageous embodiments may include an arc fault monitoring system that has a monitoring unit, a number of sensors, a number of cables, and a number of thermoelectric generators. A number, as used herein, refers to one or more items. For example, a number of sensor units is one or more sensor units.

In some of the illustrative examples, the number of sensor units is capable of making measurements at a number of locations for a number of loads. The number of cables connect the monitoring unit to the number of sensor units. The number of thermoelectric generators is capable of generating power for at least one of the monitoring unit and the number of sensor units.

The monitoring unit is capable of receiving measurements from the number of sensor units through the number of cables. Further, the monitoring unit is capable of determining whether an arc fault has occurred from the measurements received through the number of cables. This arc fault may be, for example, caused by conductors in the power lines being exposed in a manner that allows arcing. Further, the arc faults also may include, for example, faults caused by loose connections of power lines to connectors. These measurements may be received from the number of sensor units through the number of cables.

Figure 3:
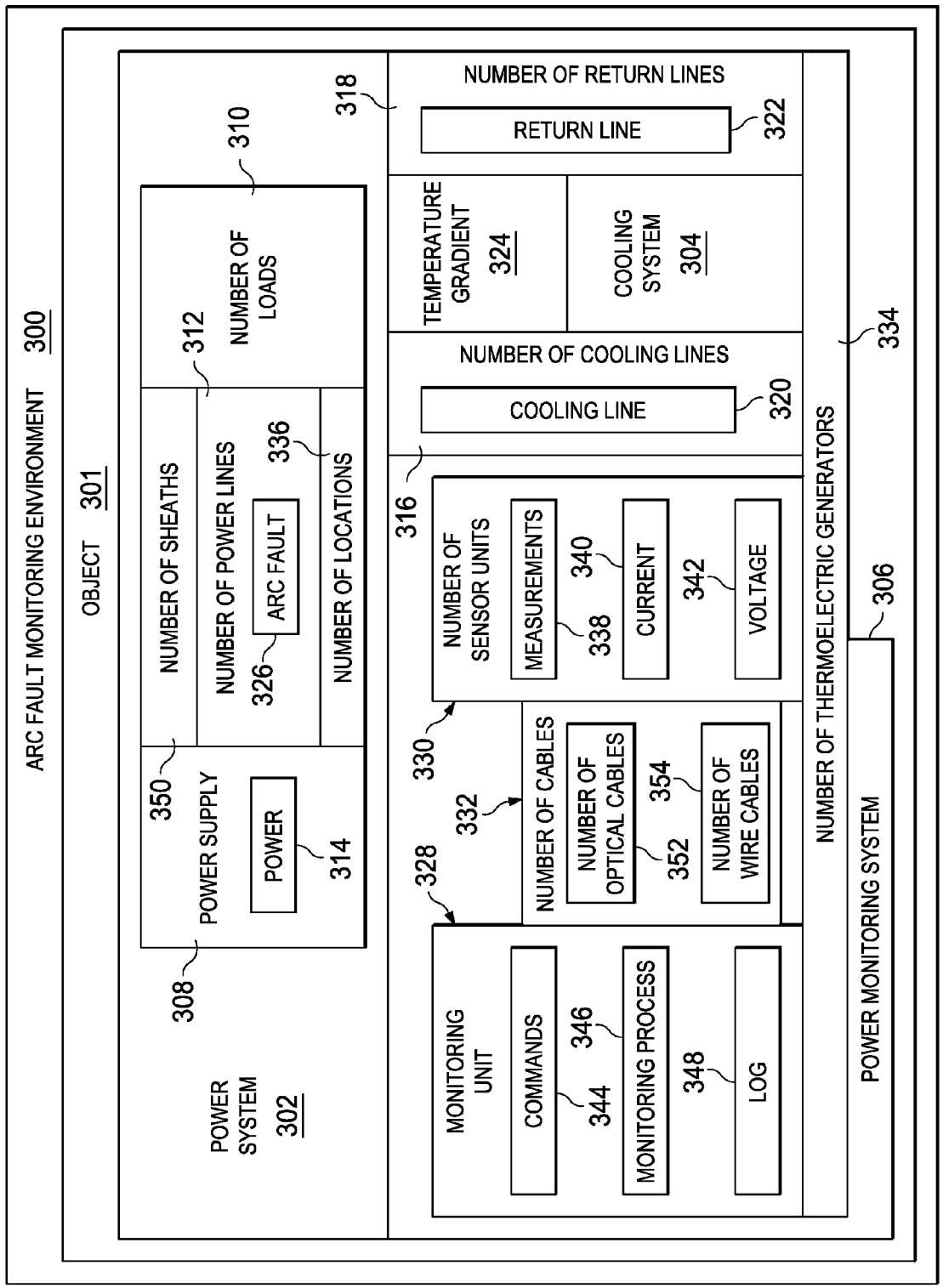
FIG. 3 is a diagram of an arc fault monitoring environment in accordance with an advantageous embodiment.

Turning now to FIG. 3, a diagram of an arc fault monitoring environment is depicted in accordance with an advantageous embodiment. In this example, arc fault monitoring environment 300 may be used to monitor for arc faults in object 301. Object 301 may be, for example, aircraft 200 in FIG. 2.

In this illustrative example, object 301 may include power system 302, cooling system 304, and power monitoring system 306. Power system 302 may have power supply 308, number of loads 310, and number of power lines 312.

Power supply 308 may be any device capable of generating power directly and/or indirectly. For example, without limitation, power supply 308 may be a battery, a linear power supply, a switch-mode power supply, a generator, or some other suitable type of power supply.

When in the form of a generator, power supply 308 may convert mechanical energy into electrical energy. An auxiliary power unit or engine on the aircraft may run a generator to generate power 314 for use by number of loads 310.

A power line within number of power lines 312 may mean assembly of two or more electrical conductors. These electrical conductors in number of power lines 312 may be covered by a number of sheaths.

Number of loads 310 may be any number of devices and/or components that are capable of using power 314. For example, number of loads 310 may take the form of a line replaceable unit, an in-flight entertainment system, an air conditioning system, a flight control computer, an actuator, and/or some other suitable device.

Cooling system 304 may provide a capability to cool power supply 308 and/or number of loads 310. Cooling system 304 may be connected to power supply 308 and/or number of loads 310 using number of cooling lines 316 and number of return lines 318. Cooling line 320 within number of cooling lines 316 may deliver coolant to a device, such as power supply 308, or a load within number of loads 310. Return line 322 may return coolant to cooling system 304 from the device.

Cooling line 320 may contain coolant that is cooler in temperature as compared to return line 322. The difference in temperature may form temperature gradient 324.

In the illustrative examples, power monitoring system 306 may monitor power system 302 for arc fault 326. Arc fault 326 may be detected using monitoring unit 328, number of sensor units 330, number of cables 332, and number of thermoelectric generators 334.

Monitoring unit 328 may be located at or around power supply 308. Number of sensor units 330 may be associated with number of locations 336 for arc faults 326. In these illustrative examples, number of sensor units 330 may be associated with the number of locations through a physical placement of number of sensor units 330 at or around number of locations 336.

Further, the association may be based on a capability of number of sensor units 330 to make measurements 338 at number of locations 336. Measurements 338 may not require number of sensor units 330 to be attached to and/or contact number of locations 336, depending on the particular implementation. Number of locations 336 may be locations along number of power lines 312. These locations may be around or associated with number of loads 310.

In these examples, number of sensor units 330 may make measurements 338 at number of locations 336. Measurements 338 may be transmitted to monitoring unit 328 over number of cables 332. In these examples, measurements 338 may include at least one of current 340 and voltage 342. Measurements 338 made by number of sensor units 330 may be used to identify the power that is delivered to the location within number of locations 336 that number of sensor units 330 are associated with in these depicted examples.

As used herein, the phrase "at least one of", when used with a list of items, means that different combinations of one or more of the items may be used and only one of each item in the list may be needed. For example, "at least one of item A, item B, and item C" may include, for example, without limitation, item A, or item A and item B. This example also may include item A, item B, and item C, or item B and item C.

Further, in some advantageous embodiments, monitoring unit 328 also may be capable of controlling the transmission of measurements 338. In controlling the transmission of measurements 338 over number of cables 332, monitoring unit 328 may send commands 344 over number of cables 332 to number of sensor units 330. In these examples, commands 344 may be used to synchronize measurements 338. For example, number of sensor units 330 may make measurements 338 at the same time.

Commands 344 may control when measurements 338 are sent by controlling when these measurements are actually sent to number of cables 332 and/or when measurements are made by number of sensor units 330. Although measurements 338 are made at the same time, measurements 338 may be sent at different times by different sensor units to reduce traffic and/or avoid interference with transmissions from other sensor units in number of sensor units 330.

With measurements 338, monitoring process 346 may analyze measurements 338 to determine whether arc fault 326 may be present. Any detection of arc fault 326 may be stored in log 348 by monitoring process 346 executing on monitoring unit 328. The receipt and/or analysis of measurements 338 may be the monitoring performed by monitoring unit 328. Further, monitoring unit 328 also may include other functions such as, for example, without limitation, generating a number of measurements within measurements 338 at a location within number of locations 336. When monitoring unit 328 is located at a location within number of locations 336 at and/or around power supply 308, monitoring unit 328 may be capable of identifying the amount of power generated by power supply 308.

In these illustrative examples, information, such as measurements 338 and commands 344, may be sent over number of cables 332 rather than using number of power lines 312. In this manner, noise and other undesirable conditions that may occur by using number of power lines 312 for transmitting measurements 338 and/or commands 344 may be avoided within power system 302.

Further, in the different advantageous embodiments, complexity and/or increased weight may be avoided by integrating number of cables 332 into number of sheaths 350. With this type of implementation, number of sheaths 350 may be placed over existing sheaths for number of power lines 312 and/or replace existing sheaths. As a result, adding power monitoring system 306 to arc fault monitoring environment 300 may reduce complexity, expense, and/or weight using power monitoring system 306.

Additionally, power monitoring system 306 may be powered without requiring a connection to components in power system 302. In these illustrative examples, power generators in the form of number of thermoelectric generators 334 may provide power to at least one of monitoring unit 328 and number of sensor units 330 without requiring power from power supply 308.

In these illustrative examples, number of thermoelectric generators 334 may take advantage of temperature gradient 324 in associated lines within number of cooling lines 316 and number of return lines 318 to generate power for different components within power monitoring system 306.

As a result, power monitoring system 306 may be added to arc fault monitoring environment 300 without requiring changes and/or modifications to different components within power system 302. This type of capability may reduce the time, cost, complexity, and expense for including a monitoring system. This type of monitoring system may be implemented during the assembly of object 301 or during an upgrade and/or maintenance for object 301.

The illustration of power monitoring system 306 may be made easier by integrating number of cables 332 with number of sheaths 350. In one or more of the illustrative examples, number of sheaths 350 may be implemented using a braid, such as a Nomex® braid. A Nomex® braid may be a sheath that may include an optical fiber that may be capable of being placed around a power line. Of course, any other type of material and/or sheath may be used, depending on the particular implementation.

With this type of implementation for number of sheaths 350, number of cables 332 may be integrated within and/or attached to number of sheaths 350. In these illustrative examples, number of cables 332 may be, for example, without limitation, at least one of number of optical cables 352, number of wire cables 354, and/or any other type of cables.

Number of sheaths 350 may replace existing sheaths when power monitoring system 306 is implemented as an upgrade or retrofit to an existing aircraft. In some advantageous embodiments, number of sheaths 350 may be placed over existing sheaths, depending on the particular embodiment.

The illustration of arc fault monitoring environment 300 in FIG. 3 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components that may be combined with and/or divided into different blocks when implemented in different advantageous embodiments.

For example, in some advantageous embodiments, an additional power supply, in addition to power supply 308, may be present within object 301 in arc fault monitoring environment 300. This power supply may also provide power to number of loads 310 and/or other loads. Additionally, in other advantageous embodiments, cooling system 304 may be unnecessary. In this type of implementation, power monitoring system 306 may obtain power from some other generation source. For example, a separate power supply may be provided for power monitoring system 306.

In yet other advantageous embodiments, generators may generate electric energy for the different components within power monitoring system 306 through vibrations that may be present in object 301 during the operation of object 301. In some advantageous embodiments, loads may be transmitted to another data processing system in addition to and/or in place of storing the information in log 348.

Figure 4:
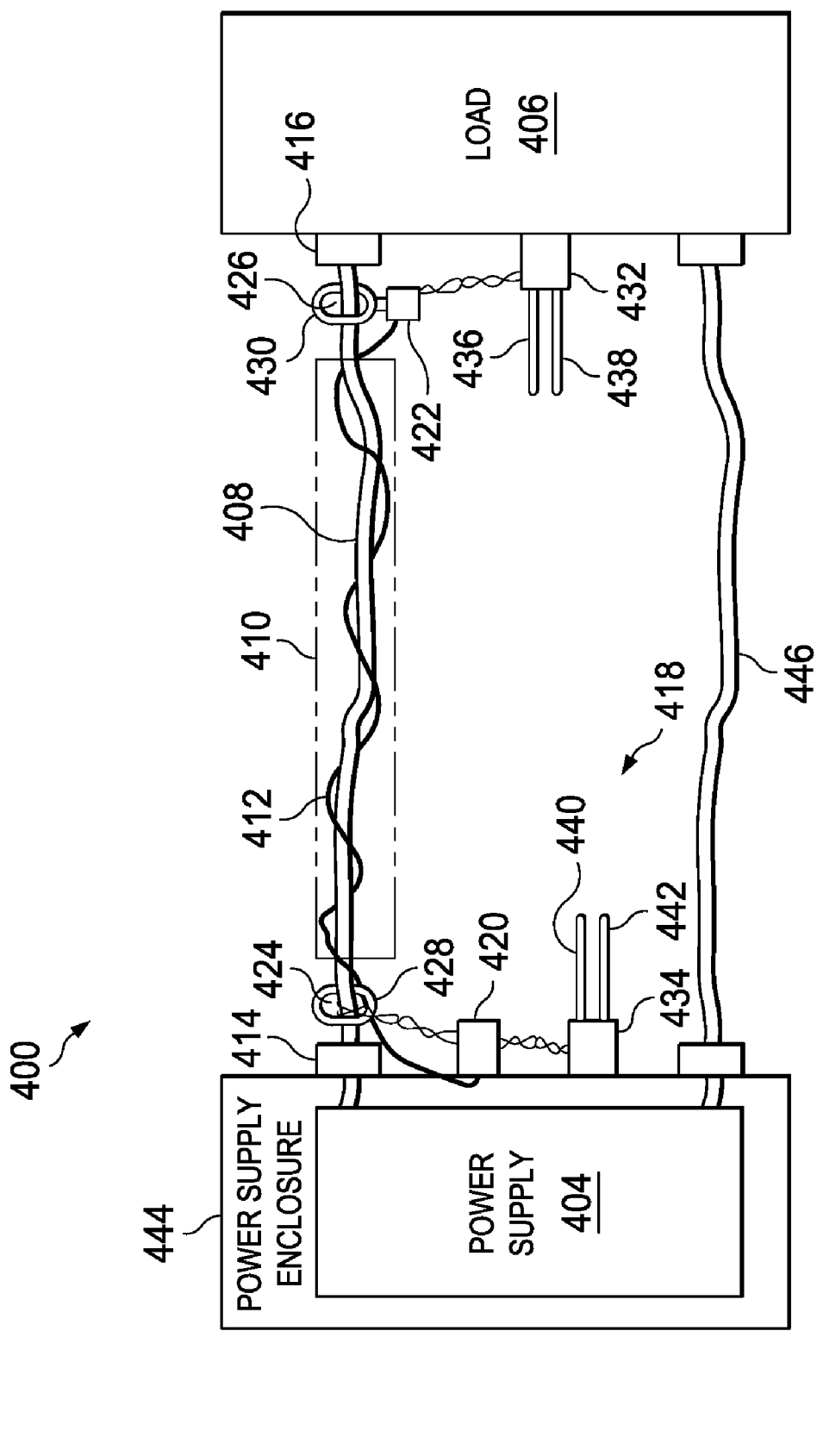
FIG. 4 is a diagram illustrating a fault monitoring environment in accordance with an advantageous embodiment.

With reference now to FIG. 4, a diagram illustrating a fault monitoring environment is depicted in accordance with an advantageous embodiment. In this illustrative example, fault monitoring environment 400 is an example of one implementation of arc fault monitoring environment 300 in FIG. 3. In this example, power supply system 402 may include power supply 404 and load 406. Load 406 may be, for example, an avionics box.

Power may be supplied to load 406 from power supply 404 through power line 408. Power line 408 may contain two conductors in this example. Power may be transmitted as direct current power in which one conductor in power line 408 sends power to load 406, while the other conductor provides return back to power supply 404.

In this example, power line 408 may have sheath 410 with optical cable 412 integrated into sheath 410. Optical cable 412 may be integrated with sheath 410. Sheath 410 is shown in phantom, in this depicted example, to illustrate the integration of optical cable 412 within sheath 410.

In some advantageous embodiments, optical cable 412 may be integrated with sheath 410 by being wrapped around sheath 410. In other advantageous embodiments, optical cable 412 may be part of sheath 410 when integrated with sheath 410.

In this example, power line 408 is connected to power supply 404 using connector 414 and to load 406 by connector 416. As illustrated, monitoring system 418, in this example, includes monitoring unit 420 and sensor unit 422. In this depicted example, monitoring unit 420 also may include components used in sensor unit 422. These components may be used within monitoring unit 420 to monitor connector 414.

Monitoring unit 420 makes measurements at location 424 for power line 408, while sensor unit 422 makes measurements at location 426 for power line 408. The measurements made by monitoring unit 420 may be used to identify the power being supplied by power supply 404 at location 424. The measurements made by sensor unit 422 may be used to identify the power reaching location 426. These measurements may be used to identify any arc faults that may occur between location 424 and location 426 in the depicted examples.

In these illustrative examples, monitoring unit 420 and sensor unit 422 may be powered using thermoelectric generators 432 and 434. Thermoelectric generator 432 is connected to cooling line 436 and return line 438. In a similar manner, thermoelectric generator 434 is connected to cooling line 440 and return line 442. The temperature gradient between cooling line 436 and return line 438 and between cooling line 440 and return line 442 may be present due to temperature differences. The temperature gradient may provide the energy needed for thermoelectric generator 432 and thermoelectric generator 434 to generate power for monitoring unit 420 and sensor unit 422 to operate.

In this illustrative example, monitoring unit 420 makes measurements at location 424 using current transformer 428. Sensor unit 422 monitors location 426 using current transformer 430.

In these examples, the power is sent as a direct current. Power line 446 may be a return for current sent through power line 408. Monitoring of power line 446 also may be performed using additional sensors and optical cables, depending on the implementation. As can be seen in this illustrative example, the addition of monitoring system 418 does not require access and/or direct connections to power supply 404 and load 406. Monitoring unit 420 may be attached to power supply enclosure 444 for power supply 404. In a similar fashion, sensor unit 422 also may be connected to the exterior of load 406.

Communication between these units may be made through optical cable 412 with sheath 410. Sheath 410 may be used to replace an original sheath for power line 408 or may be placed on top of an existing sheath for power line 408.

Further, thermoelectric generator 432 and thermoelectric generator 434 may provide power without requiring electrical connections to power supply 404, load 406, and/or power line 408. Additionally, current transformer 428 and current transformer 430 may be used to make measurements without physical and/or electrical connections to power line 408.

Figure 5:
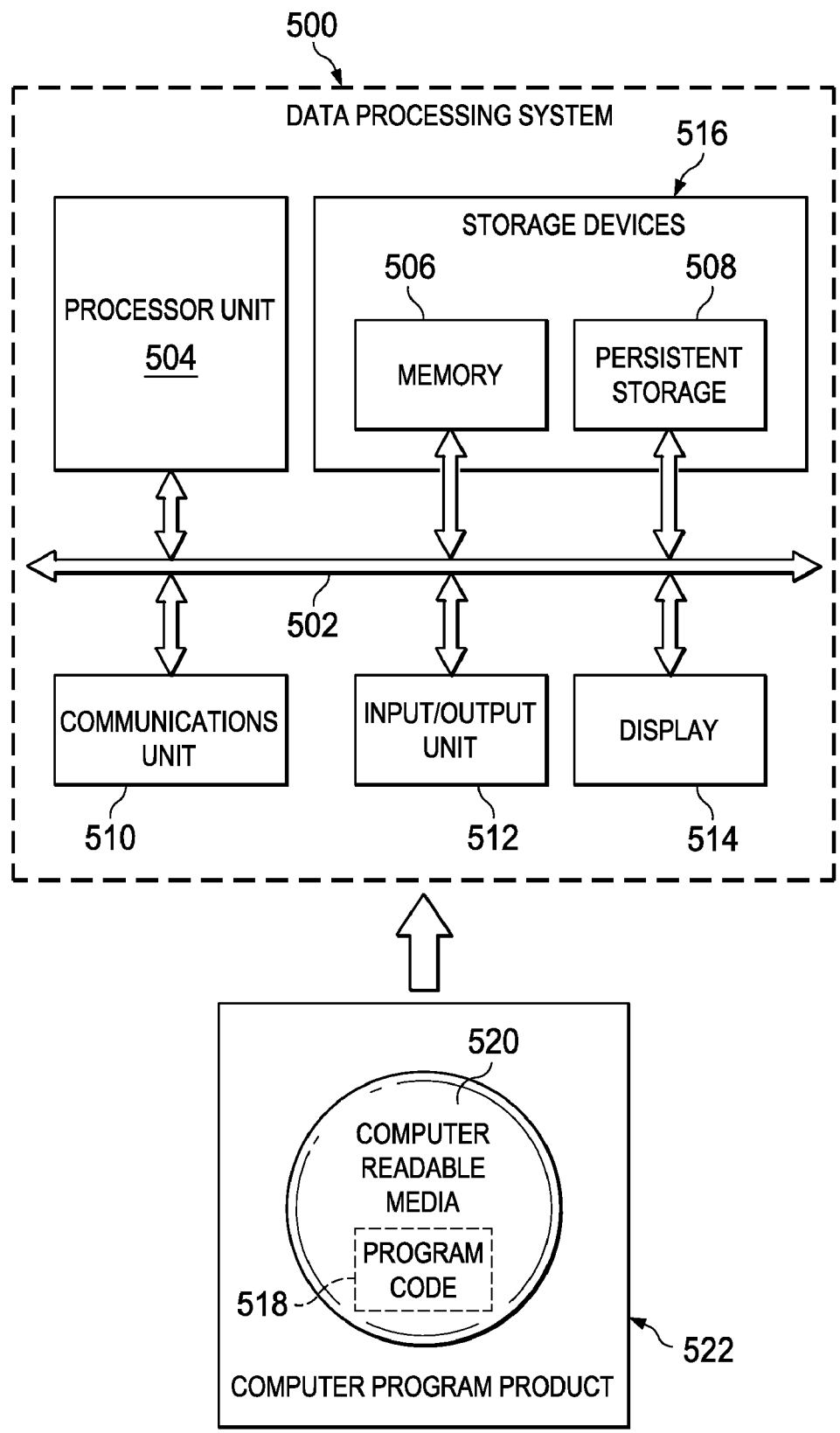
FIG. 5 is a diagram of a data processing system in accordance with an advantageous embodiment.

Turning now to FIG. 5, a diagram of a data processing system is depicted in accordance with an advantageous embodiment. Data processing system 500 is an example of a data processing system that may be used to implement monitoring unit 328 in FIG. 3 and monitoring unit 420 in FIG. 4. In this illustrative example, data processing system 500 includes communications fabric 502, which provides communications between processor unit 504, memory 506, persistent storage 508, communications unit 510, input/output (I/O) unit 512, and display 514.

Processor unit 504 serves to execute instructions for software that may be loaded into memory 506. Processor unit 504 may be a set of one or more processors or may be a multi-processor core, depending on the particular implementation. Further, processor unit 504 may be implemented using one or more heterogeneous processor systems in which a main processor is present with secondary processors on a single chip. As another illustrative example, processor unit 504 may be a symmetric multi-processor system containing multiple processors of the same type.

Memory 506 and persistent storage 508 are examples of storage devices 516. A storage device is any piece of hardware that is capable of storing information such as, for example, without limitation, data, program code in functional form, and/or other suitable information either on a temporary basis and/or a permanent basis. Memory 506, in these examples, may be, for example, a random access memory or any other suitable volatile or non-volatile storage device.

Persistent storage 508 may take various forms, depending on the particular implementation. For example, persistent storage 508 may contain one or more components or devices. For example, persistent storage 508 may be a hard drive, a flash memory, a rewritable optical disk, a rewritable magnetic tape, or some combination of the above. The media used by persistent storage 508 also may be removable. For example, a removable hard drive may be used for persistent storage 508.

Communications unit 510, in these examples, provides for communications with other data processing systems or devices. In these examples, communications unit 510 is a network interface card. Communications unit 510 may provide communications through the use of either or both physical and wireless communications links.

Input/output unit 512 allows for input and output of data with other devices that may be connected to data processing system 500. For example, input/output unit 512 may provide a connection for user input through a keyboard, a mouse, and/or some other suitable input device. Further, input/output unit 512 may send output to a printer. Display 514 provides a mechanism to display information to a user.

Instructions for the operating system, applications, and/or programs may be located in storage devices 516, which are in communication with processor unit 504 through communications fabric 502. In these illustrative examples, the instructions are in a functional form on persistent storage 508. These instructions may be loaded into memory 506 for execution by processor unit 504. The processes of the different embodiments may be performed by processor unit 504 using computer implemented instructions, which may be located in a memory, such as memory 506.

These instructions are referred to as program code, computer usable program code, or computer readable program code that may be read and executed by a processor in processor unit 504. The program code in the different embodiments may be embodied on different physical or tangible computer readable media, such as memory 506 or persistent storage 508.

Program code 518 is located in a functional form on computer readable media 520 that is selectively removable and may be loaded onto or transferred to data processing system 500 for execution by processor unit 504. Program code 518 and computer readable media 520 form computer program product 522 in these examples. In one example, computer readable media 520 may be in a tangible form such as, for example, an optical or magnetic disk that is inserted or placed into a drive or other device that is part of persistent storage 508 for transfer onto a storage device, such as a hard drive that is part of persistent storage 508.

In a tangible form, computer readable media 520 also may take the form of a persistent storage, such as a hard drive, a thumb drive, or a flash memory that is connected to data processing system 500. The tangible form of computer readable media 520 is also referred to as computer recordable storage media. In some instances, computer readable media 520 may not be removable.

Alternatively, program code 518 may be transferred to data processing system 500 from computer readable media 520 through a communications link to communications unit 510 and/or through a connection to input/output unit 512. The communications link and/or the connection may be physical or wireless in the illustrative examples. The computer readable media also may take the form of non-tangible media, such as communications links or wireless transmissions containing the program code.

In some illustrative embodiments, program code 518 may be downloaded over a network to persistent storage 508 from another device or data processing system for use within data processing system 500. For instance, program code stored in a computer readable storage medium in a server data processing system may be downloaded over a network from the server to data processing system 500. The data processing system providing program code 518 may be a server computer, a client computer, or some other device capable of storing and transmitting program code 518.

The different components illustrated for data processing system 500 are not meant to provide architectural limitations to the manner in which different embodiments may be implemented. The different illustrative embodiments may be implemented in a data processing system including components in addition to or in place of those illustrated for data processing system 500.

Other components shown in FIG. 5 can be varied from the illustrative examples shown. The different embodiments may be implemented using any hardware device or system capable of executing program code. As one example, the data processing system may include organic components integrated with inorganic components and/or may be comprised entirely of organic components excluding a human being. For example, a storage device may be comprised of an organic semiconductor.

As another example, a storage device in data processing system 500 is any hardware apparatus that may store data. Memory 506, persistent storage 508, and computer readable media 520 are examples of storage devices in a tangible form.

In another example, a bus system may be used to implement communications fabric 502 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 506 or a cache such as found in an interface and memory controller hub that may be present in communications fabric 502.

Figure 6:
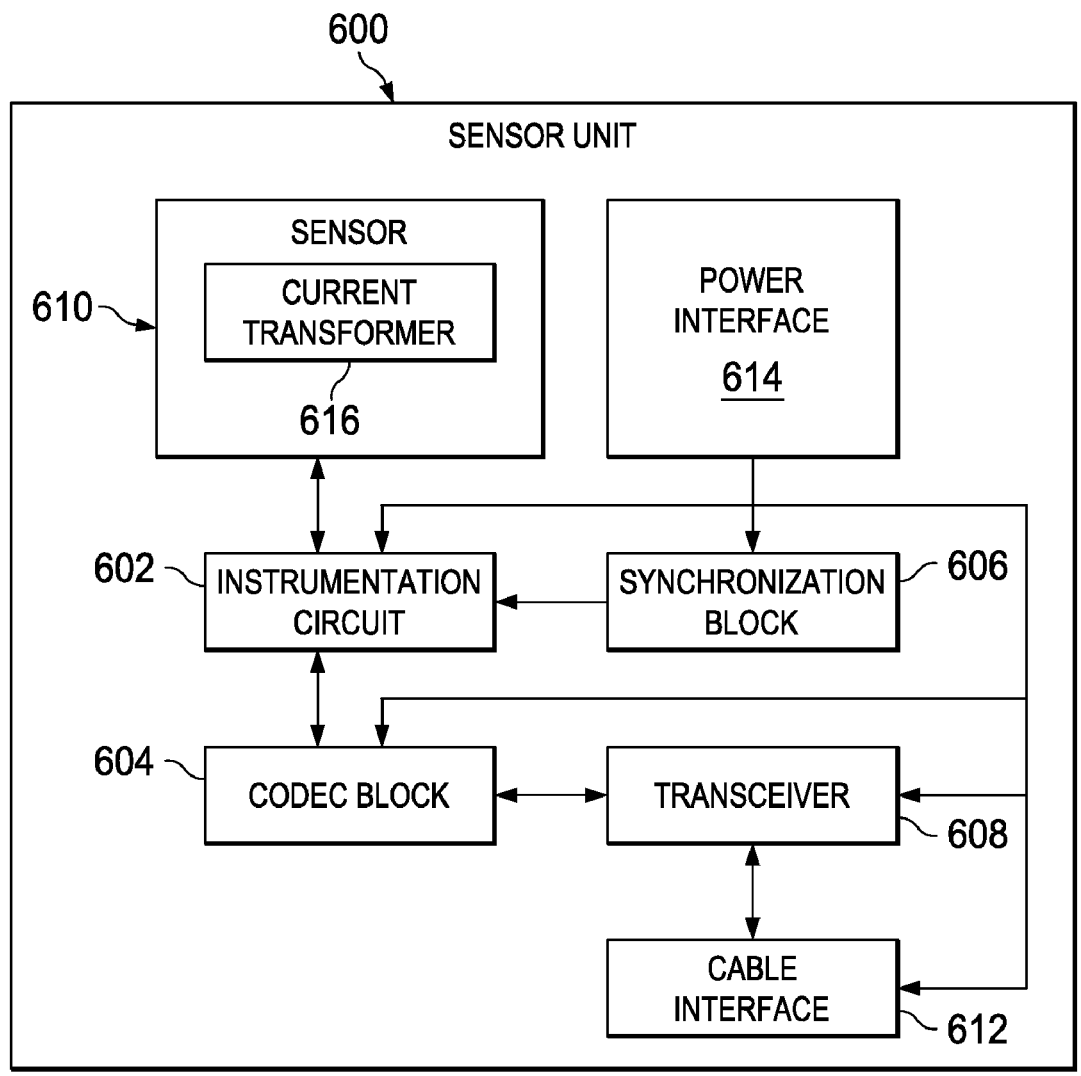
FIG. 6 is a diagram of a sensor unit in accordance with an advantageous embodiment.

Turning next to FIG. 6, a diagram of a sensor unit is depicted in accordance with an advantageous embodiment. Sensor unit 600 is an example of an implementation for a sensor unit in number of sensor units 330 in FIG. 3 and sensor unit 422 in FIG. 4. The components in sensor unit 600 also may be used within a monitoring unit to detect the power being supplied to different loads.

Sensor unit 600 may include processor 601, instrumentation circuit 602, codec block 604, synchronization block 606, transceiver 608, sensor 610, cable interface 612, and power interface 614.

Processor 601 controls the operation of sensor unit 600 in these illustrative examples. Processor 601 may receive commands through codec block 604. Codec block 604 may provide data translation between data generated by instrumentation circuit 602 for transmission to a monitoring unit and data received through transceiver 608 from the monitoring unit. In other words, codec block 604 acts as a translator and may place the data in a format that may be used by processor 601 and by the monitoring unit to which measurements are sent.

For example, codec block 604 may encode measurements and other information generated by instrumentation circuit 602 for transmission to a monitoring unit through transceiver 608. Further, commands and other information received from a monitoring unit through transceiver 608 may be converted for use by processor 601.

In this illustrative example, instrumentation circuit 602 may perform current and voltage measurements from signals generated by sensor 610. In this illustrative example, sensor 610 may be, for example, without limitation, current transformer 616. Current transformer 616 may be capable of providing a current based on current flow within a power line. This current may be generated without requiring a physical or electrical connection to the power line. From the current generated, current and/or voltage measurements may be made.

Transceiver 608 provides a capability to transfer information between sensor unit 600 and a monitoring unit. Information may be sent and received by sensor unit 600 in these examples. Cable interface 612 may provide a capability to change electrical signals into optical signals for transmission over an optical cable.

Synchronization block 606 may initiate sampling by instrumentation circuit 602. The initialization of sampling may be controlled by processor 601 in response to commands received from a monitoring unit. In other advantageous embodiments, processor 601 may control synchronization block 606 through a program executed by processor 601. Synchronization block 606 may be implemented using a number of different circuits. For example, synchronization block 606 may be implemented using a phase lock loop or other synchronization circuit for selecting sampling times. The frequency at which synchronization block 606 may initiate sampling may be controlled by the monitoring unit.

The illustration of sensor unit 600 in FIG. 6 is provided as an example of one implementation and not meant to imply physical or architectural limitations to the manner in which sensor units in other advantageous embodiments may be implemented. For example, in some advantageous embodiments, instrumentation circuit 602 may take the form of a processor and may include other functions not shown in FIG. 6. For example, a processor may include translation functions provided by codec block 604. In yet other advantageous embodiments, sensor unit 600 may have a number of additional sensors in addition to sensor 610.

Power interface 614 provides a capability to receive power from a power generation source such as, for example, without limitation, a thermoelectric generator. Power interface 614 provides power to the different components within sensor unit 600.

Figure 7:
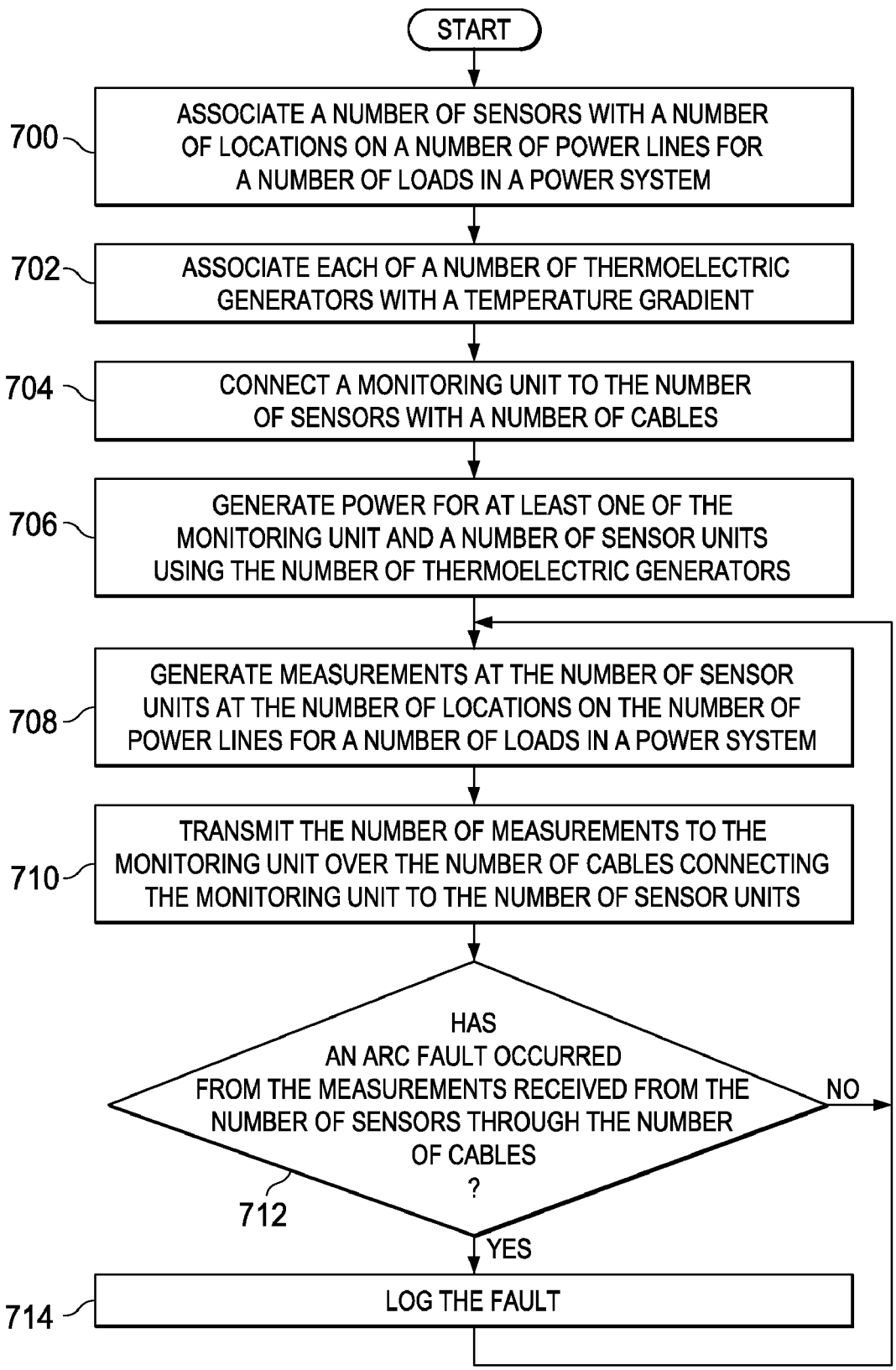
FIG. 7 is a flowchart of a process for monitoring a power system in accordance with an advantageous embodiment.

With reference now to FIG. 7, a flowchart of a process for monitoring a power system is depicted in accordance with an advantageous embodiment. The process illustrated in FIG. 7 may be implemented in a fault monitoring environment such as, for example, arc fault monitoring environment 300 in FIG. 3.

The process begins by associating a number of sensors with a number of locations on a number of power lines for a number of loads in a power system (operation 700). Thereafter, each of a number of thermoelectric generators is associated with a temperature gradient (operation 702). In these illustrative examples, the association of a thermoelectric generator with a temperature gradient may be made by connecting the thermoelectric generator to a cooling line and a return line for a cooling system. Of course, other sources of temperature gradients may be used, depending on the particular implementation.

A monitoring unit is connected to the number of sensors with a number of cables (operation 704). In this example, each cable is connected to a sensor unit. Of course, in some advantageous embodiments, multiple sensor units may be connected to the same cable, depending on the implementation.

Operation 704 may involve placing a sheath with a cable on each power line in the number of power lines. In these depicted examples, the cable is an optical cable. Of course, other types of cable may be used in the different illustrative examples. The cable may then be connected to the monitoring unit and the associated sensor unit for that location on the power line. Of course, in other advantageous embodiments, a cable may be wound and/or wrapped around the existing sheath. Further, in some advantageous embodiments, the existing sheath may remain in place with the sheath containing the cable being placed over the existing sheath.

Afterwards, power may be generated for at least one of the monitoring unit and a number of sensor units using the number of thermoelectric generators (operation 706). Although, in the depicted examples, thermoelectric generators are used to power all of the different components, in other advantageous embodiments, only a subset of these components may be powered using thermoelectric generators.

Measurements are generated at the number of sensor units at the number of locations on the number of power lines for a number of loads in a power system (operation 708). In these examples, the thermoelectric generators are outside of the power system for the number of loads.

The number of measurements is then transmitted to the monitoring unit over the number of cables connecting the monitoring unit to the number of sensor units (operation 710). A determination is made by the monitoring unit as to whether an arc fault has occurred from the measurements received from the number of sensors through the number of cables (operation 712).

If an arc fault is present, the process may log the fault (operation 714). In some advantageous embodiments, the process also may generate an alert. The alert may be presented in a display, presented in a control panel, sent in an email, and/or by some other suitable mechanism. The process then returns to operation 708. If an arc fault is not present, the process also returns to operations 708.

Figure 8:
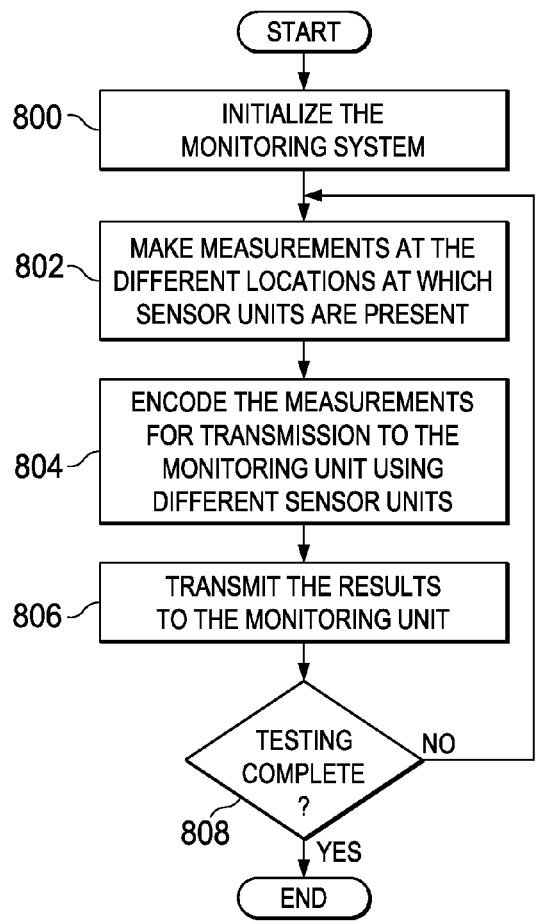
FIG. 8 is a flowchart of a process for monitoring for faults in a power system in accordance with an advantageous embodiment.

Turning now to FIG. 8, a flowchart of a process for monitoring for faults in a power system is depicted in accordance with an advantageous embodiment. The process illustrated in FIG. 8 may be implemented in an arc fault monitoring environment such as, for example, arc fault monitoring environment 300 in FIG. 3.

The process begins by initializing the monitoring system (operation 800). During operation 800, power may be provided to the different loads, and the monitoring system may generate sampling signals and/or commands. Measurements are made at the different locations at which sensor units are present (operation 802).

In this illustrative example, the sampling may be made all at the same time. In these examples, the sampling may be synchronized, in which the measurements are made all at the same time.

Next, the different sensor units encode the measurements for transmission to the monitoring unit (operation 804). The results are transmitted to the monitoring unit (operation 806). A determination is made as to whether testing is completed (operation 808). If testing is not complete, the process returns to operation 802. Otherwise, the operation terminates.

Figure 9:
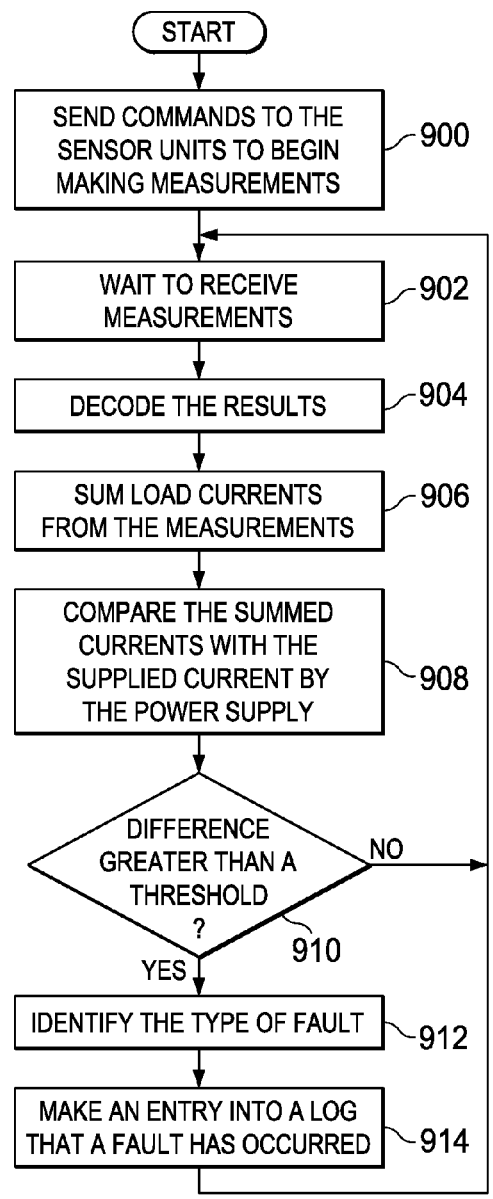
FIG. 9 is a flowchart of a process for monitoring for faults in accordance with an advantageous embodiment.

Turning now to FIG. 9, a flowchart of a process for monitoring for faults is depicted in accordance with an advantageous embodiment. The process illustrated in FIG. 9 may be implemented in a monitoring unit such as, for example, monitoring unit 328 in FIG. 3.

The process begins by sending commands to the sensor units to begin making measurements (operation 900). These commands may result in the different sensor units making measurements at the same time. Further, these commands may also indicate when measurements are to be returned. These commands may be such that different sensor units send back measurements at different times to avoid collision of measurements within the cables.

The process then waits to receive measurements (operation 902). When measurements are received, the results are decoded (operation 904). The process sums load currents from the measurements (operation 906).

The summed currents are compared with the supplied current by the power supply (operation 908). A determination is made as to whether the comparison indicates that a difference is greater than a threshold (operation 910).

The process then identifies the type of fault (operation 912). For example, without limitation, the threshold for the difference may be around minus 10 percent of the total current from the power supply. For example, if the power supply generates 11 amps and the sum of the load currents identified by the sensor units is 10 amps, a fault condition is identified and placed into the log. In this example, an arc fault may be, for example, a ground and/or parallel arc fault.

As another example, the threshold may determine whether the current drops to zero. If the current drops to zero, then a series fault may be present. An entry is made into a log that a fault has occurred (operation 914). In these examples, this entry may include information such as, for example, an identification of the fault type, the time of the fault, a location of the fault, and/or other suitable information. The process then returns to operation 902 to wait to receive measurements.

With reference again to operation 910, if the difference is not greater than a threshold, the process returns to operation 902, as discussed above.

The flowcharts and block diagrams in the different depicted embodiments illustrate the architecture, functionality, and operation of some possible implementations of apparatus and methods in different advantageous embodiments. In this regard, each block in the flowcharts or block diagrams may represent a module, segment, function, and/or a portion of an operation or step. In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved.

Thus, the different advantageous embodiments provide a capability to monitor for arc faults in a power system. In one or more different advantageous embodiments, a monitoring unit, a number of sensor units, a number of cables, and a number of thermoelectric generators are present. The number of sensor units is capable of making measurements at a number of locations on a number of power lines for a number of loads.

The number of cables connects the monitoring unit to the number of sensor units and provides a medium to transfer data between these components. The number of thermoelectric generators is capable of generating power for at least one of the monitoring unit and/or the number of sensor units. The monitoring unit is capable of receiving measurements from the number of sensor units through the number of cables and determining whether an arc fault has occurred from the measurements received.

The different advantageous embodiments may provide a capability to include a monitoring system that does not interfere with and/or require electrical connections to any components in the power system. The different advantageous embodiments provide a capability to transfer information without creating noise in the power being delivered to various loads. Further, the different advantageous embodiments also may provide a capability to operate without requiring power from the power system itself.

These and other different features of the different advantageous embodiments may provide a capability to include a monitoring system to monitor a power supply system in a manner that may reduce expense, complexity, and/or reliability issues that may be present with other types of monitoring techniques.

The description of the different advantageous embodiments has been presented for purposes of illustration and description, and it is not intended to be exhaustive or limited to the embodiments in the form disclosed. Many modifications and variations will be apparent to those of ordinary skill in the art. Although the different advantageous embodiments have been described with respect to aircraft, other advantageous embodiments may be applied to other types of objects.

For example, without limitation, other advantageous embodiments may be applied to a mobile platform, a stationary platform, a land-based structure, an aquatic-based structure, a space-based structure, and/or some other suitable object. More specifically, the different advantageous embodiments may be applied to, for example, without limitation, a submarine, a bus, a personnel carrier, a tank, a train, an automobile, a spacecraft, a space station, a satellite, a surface ship, a power plant, a dam, a manufacturing facility, a building, and/or some other suitable object.

Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An arc fault monitoring system comprising:
   a monitoring unit associated with a power supply;
   a number of sensor units associated with a number of loads connected to the power supply by a number of power lines and capable of making measurements for the number of power lines associated with the number of loads and transmitting the measurements to the monitoring unit;
   a number of optical cables connecting the monitoring unit to the number of sensor units, wherein the number of optical cables is integrated with a number of sheaths covering the number of power lines; and
   a number of thermoelectric generators capable of generating power to operate the monitoring unit and the number of sensor units, wherein an electric generator in the plurality of thermoelectric generators is with the monitoring unit and each of the number of sensor units, wherein the monitoring unit is capable of controlling measurements made by the number of sensor units, receiving the measurements through the number of optical cables, and determining whether an arc fault has occurred from the measurements received through the number of optical cables.

2. The arc fault monitoring system of claim 1 further comprising:
   the power supply;
   the number of loads; and
   the number of power lines.

3. The arc fault monitoring system of claim 2 further comprising:
   a cooling system;
   a number of cooling lines connecting the cooling system to the number of loads and capable of carrying a coolant from the cooling system to the number of loads; and
   a number of return lines connecting the cooling system to the number of loads and capable of carrying a warmed coolant warmed by the number of loads to the cooling system, wherein the number of thermoelectric generators generates power for the monitoring unit and the number of sensor units using a temperature gradient between the number of cooling lines and the number of return lines.

4. The arc fault monitoring system of claim 3, wherein the object is selected from one of a mobile platform, a stationary platform, a land-based structure, an aquatic-based structure, a space-based structure, an aircraft, a surface ship, a tank, a personnel carrier, a train, a spacecraft, a space station, a satellite, a submarine, an automobile, a power plant, a bridge, a dam, a manufacturing facility, and a building.

5. The arc fault monitoring system of claim 1 further comprising:
   an object, wherein the monitoring unit, the number of sensor units, the number of optical cables, and the number of thermoelectric generators is located in the object.

6. The arc fault monitoring system of claim 1, wherein the measurements are current measurements.

7. The arc fault monitoring system of claim 1, wherein the arc fault is selected from one of a ground arc fault, a parallel arc fault, and a serial arc fault.

8. An apparatus comprising:
   a monitoring unit;
   a number of sensor units capable of making measurements at a number of locations on a number of power lines for a number of loads;
   a number of cables connecting the monitoring unit to the number of sensor units; and
   a number of thermoelectric generators capable of generating power for at least one of the monitoring unit and the number of sensor units, wherein the monitoring unit is capable of receiving measurements from the number of sensor units through the number of cables and determining whether an arc fault has occurred from the measurements received through the number of cables.

9. The apparatus of claim 8 further comprising:
   a power supply;
   the number of loads; and
   the number of power lines.

10. The apparatus of claim 8, wherein the number of thermoelectric generators generates power for the monitoring unit and the number of sensor units.

11. The apparatus of claim 8, wherein the monitoring unit is further capable of controlling a transmission of the measurements by the number of sensor units.

12. The apparatus of claim 8, wherein the measurements are current measurements.

13. The apparatus of claim 8, wherein the arc fault is selected from one of a ground arc fault, a parallel arc fault, and a serial arc fault.

14. The apparatus of claim 8, wherein the monitoring unit, the number of sensor units, the number of cables, and the number of thermoelectric generators is located in an object.

15. The apparatus of claim 14, wherein the object is selected from one of a mobile platform, a stationary platform, a land-based structure, an aquatic-based structure, a space-based structure, an aircraft, a surface ship, a tank, a personnel carrier, a train, a spacecraft, a space station, a satellite, a submarine, an automobile, a power plant, a bridge, a dam, a manufacturing facility, and a building.

16. The apparatus of claim 8, wherein the number of cables is selected from at least one of a number of optical cables and a number of wire cables.

17. A method for monitoring a power system, the method comprising:
   generating power for at least one of a monitoring unit and a number of sensor units using a number of thermoelectric generators;
   generating measurements at the number of sensor units at a number of locations on a number of power lines for a number of loads in the power system, wherein the number of thermoelectric generators is outside of the power system for the number of loads;

transmitting the measurements to the monitoring unit over a number of cables connecting the monitoring unit to the number of sensor units; and determining by the monitoring unit whether an arc fault has occurred from the measurements received from the number of sensor units through the number of cables.

18. The method of claim 17 further comprising:

associating the number of sensor units with the number of locations on the number of power lines for the number of loads in the power system;

associating each of the number of thermoelectric generators with a temperature gradient; and connecting the monitoring unit with the number of sensor units with the number of cables.

19. The method of claim 18, wherein the connecting step comprises:

placing a sheath with a cable on each power line in the number of power lines; and connecting the cable to the monitoring unit and an associated sensor unit in the number of sensor units.

20. The method of claim 17, wherein the arc fault is selected from one of a ground arc fault, a parallel arc fault, and a serial arc fault.

21. The method of claim 17, wherein the number of cables is selected from at least one of a number of optical cables and a number of wire cables.

* * * * *